United States Patent [19]

Harman

[11] 4,088,967
[45] May 9, 1978

[54] SPLIT-RING DIGITAL PHASE MODULATOR

[75] Inventor: Stephen George Harman, Ottawa, Canada

[73] Assignee: Northern Telecom Limited, Montreal, Canada

[21] Appl. No.: 789,242

[22] Filed: Apr. 20, 1977

[51] Int. Cl.² .............................................. H03C 3/38
[52] U.S. Cl. .................................... 332/23 R; 332/47
[58] Field of Search ............................ 332/47, 24, 23; 329/204; 325/38, 145

[56] References Cited

U.S. PATENT DOCUMENTS

| 2,902,659 | 9/1959 | Ketchledge | 332/47 |
| 3,029,399 | 4/1962 | Leeds | 332/47 |

Primary Examiner—John Kominski
Attorney, Agent, or Firm—John E. Mowle

[57] ABSTRACT

A transformer coupled split-ring diode modulator for digital phase modulation of a data stream in which the diodes are back-biased so as to provide additional attenuation of in-band fold-over side lobes which appear in the pass-band; the additional attenuation resulting from a cosine attenuation function which is dependent upon the switching time of the diodes and hence the bias voltage applied thereto.

6 Claims, 4 Drawing Figures

SPLIT-RING DIGITAL PHASE MODULATOR

This invention relates to a split-ring digital phase modulator and more particularly to one which provides suppression of in-band spurious side lobes generated within the modulator.

BACKGROUND OF THE INVENTION

Ring modulators utilizing diodes have been used in the past to provide digital phase modulation of a data stream. An example of such a modulator is illustrated in U.S. Pat. No. 2,727,210 issued Dec. 13, 1955, and invented by D. G. Holloway. An inherent problem with a conventional diode ring modulator is that non-linearity in the diodes causes asymmetry of the switching envelope. In addition, the asymmetry and switching time of the diodes are not easily controlled independently of each other. Distortion due to this asymmetry can be minimized by fast switching of the diodes. However, the fast switching transfers additional power into higher order sidebands, which include fold-over components centered about zero frequency that appear in the passband at the output of the modulator. In addition, fast risetimes of the switching voltages are difficult to generate and control. A recent article which further discusses some of the problems encountered in such modulators is entitled: "Sources of Intermodulation In Diode-Ring Mixers" by H. P. Walker; The Radio and Electronic Engineer, May 1976, pp.247–255. Still another which compares the various types of modulators is entitled: "Comparison of Transformerless Ring Modulators and Cross Modulators" by Zdenek Mack; The Radio and Electronic Engineer, August 1974, pp.407–413.

An alternate form of modulator to the conventional ring modulator is a split-ring modulator. Examples of such modulators are found in U.S. Pat. No. 2,922,960 issued Jan. 26, 1960, and invented by B. R. Stachiewicz; and U.S. Pat. No. 2,958,051, issued Oct. 25, 1960, and invented by W. C. Perkins. These modulators may include steering diodes and a bias source to control the switching time. With this arrangement, symmetry is maintained independently of the switching time. The "switching time" refers to the time taken by the modulator to accomplish a 180° phase reversal of the carrier to essentially the same constant output amplitude.

As is well known, phase modulation of a carrier produces a main power lobe centered about the carrier frequency as well as a plurality of ever-decreasing side lobes with nulls occurring at multiples of the data switching rate. The lower side lobes fold over about zero frequency with the result that spurious in-band side lobes will be generated in the passband of the modulator. This can be particularly disturbing in wide-band systems where the modulated carrier is only several times that of the data stream rate.

The problem of side lobe generation is discussed in an article entitled: "Spectrum Control in a Four-Phase PM Modem" by R. J. Tarry; Telecommunications, April 1968, pp.27–30. The solution proposed by this author, for suppressing the spurious in-band side lobes, is to modulate the carrier at a higher frequency, filter out the lower side bands and then translate the spectrum down in frequency. However, the example given is for phase modulation of a single voice channel and may not be practical for very wide band systems.

STATEMENT OF THE INVENTION

It has been discovered that a split-ring modulator, in addition to producing a series of side lobes with nulls at multiples of the data stream, produces a cosine attenuation function which varies with the delay interval during switching of the diodes, that is dependant upon the bias voltage; and that a null in this cosine attenuation function of the fold-over component can be set by the bias voltage to fall in the passband of the main power lobe, with resultant attenuation of the in-band fold-over side lobes.

Thus, in accordance with the present invention, there is provided a split-ring modulator comprising: two pairs of diodes, each pair connected in series. In addition the modulator includes first and second intermediate ports connected in a ring configuration with the free ends of the diodes. Also, a first input/output port is coupled to both the intermediate ports, a second input/output port is connected between the junctions of the two pairs of diodes, and a third input/output port is coupled between the center points of the two intermediate ports and the center point of the second input/output port. The modulator also includes means for coupling a carrier signal and a data switching signal to, and a modulated output signal from, different ones of the three input/output ports. Also, the modulator includes a means for applying a reverse bias to the diodes of such magnitude to null the fold-over sidebands which fall in the in-band response of the modulated output signal.

In a particular embodiment, the diodes in each pair are connected in series opposition, the carrier signal is coupled to the first input/output port, the modulated output signal is coupled to the second input/output port, and the data switching signal is coupled differentially to the third input/output port with respect to the center point on the second input/output port. In addition, a d-c bias source is coupled longitudinally to the third input/output port with respect to said center point of the second input/output port.

Also in a particular embodiment, the modulator includes a first and a second pair of series connected resistors connected in shunt with the first and second intermediate ports respectively, the third input/output port being connected between the junctions of the two pairs of resistors. The modulator may also include a first and a second resistor for connecting the d-c bias source to each side of the third input/output port.

BRIEF DESCRIPTION OF THE DRAWINGS

An example embodiment of the invention will now be described with reference to the accompanying drawings in which:

FIG. 3, on the same sheet as FIG. 1, illustrates a typical phase reversal of the phase modulated carrier at the output of the modulator illustrated in FIG. 1; and FIG. 4 on the same sheet as FIG. 1, is a typical response pattern of the diodes illustrated in FIG. 1 showing the transient response during phase reversal of the carrier.

DESCRIPTION OF THE PREFERRED EMBODIMENT

Figure 1:
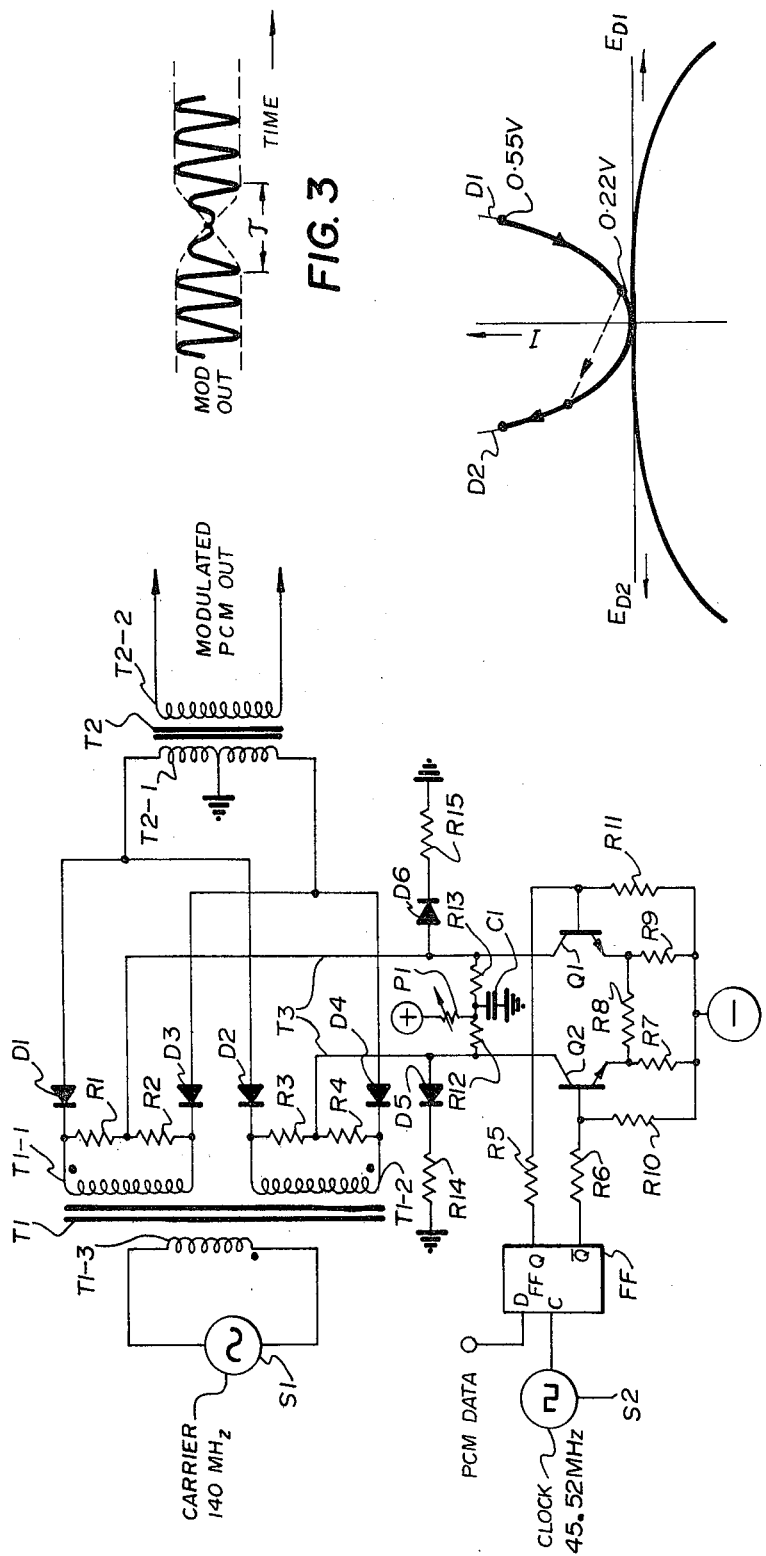
FIG. 1 is a schematic diagram of a split-ring digital phase modulator in accordance with the present invention.

Referring to FIG. 1, the split-ring modulator comprises a first pair of diodes D1, D2 and a second pair of diodes D3, D4, each pair connected in series opposition. The modulator also includes first T1-1 and second T1-2 intermediate ports comprising the secondaries of transformer T1, connected in a ring configuration with the free ends of the diodes D1–D4. Three additional ports T1-3, T2-1 and T3, which in various embodiments may function as either input or output ports, are also shown. The first, an input port T1-3 comprising the primary of transformer T1 is coupled to both the intermediate ports T1-1 and T1-2; while the second, and output port T2-1, comprising the center tapped primary of transformer T2, is connected between the junctions of the two pairs of diodes D1–D4. In addition, the third, an input port T-3, is coupled between the center points of the two intermediate ports T1-1 and T1-2. The center points are established by two pairs of resistors R1, R2 and R3, R4; each pair of which is connected in series across the secondaries of transformer T1. The resistors R1–R4 were used to provide center tapped terminations, only to simplify the design of the transformers T1 which alternately could have utilized center tapped secondaries. A source of carrier signal S1 at 140MHz is connected to the primary T1-3 of transformer T1, while a data switching signal at a 45.52MHz rate, is coupled differentially to the third input/output port T3. In addition, the modulated 140MHz carrier output is coupled from the secondary T2-2 of transformer T2. In this example embodiment a carrier frequency of 140MHz has been selected as it is currently the standard IF carrier for wide-band transmission systems. The data rate of 45.52MHz on the other hand, is determined by the channel capacity of the system. However the improvement can be readily applied to other systems.

To provide the data switching signal, a PCM data stream is connected to the control input of a D-type flip-flop FF which is clocked at 45.52MHz, by a clock source S2. The Q and $\overline{Q}$ outputs of the flip-flop FF are coupled through resistors R5 and R6 to the bases of two transistors Q1 and Q2 respectively. The collectors of the two transistors Q1 and Q2 are connected to the two terminals of the input port T3. In addition, the drive circuit includes emitter resistors R7, R8 and R9 and base resistors R10 and R11, connected in a conventional manner from the transistors Q1 and Q2 to a source of negative potential.

A bias source is developed across capacitor C1 from a positive source of voltage, the magnitude of which is controlled by potentiometer P1. The bias source across capacitor C1 is coupled longitudinally to the two terminals of the third port T3 through resistors R12 and R13. Since the transistors Q1, Q2 are current sources, the magnitude of the signal voltage applied to the third input port T3 when the transistors are turned on, is limited by associated steering diodes D5 and D6 in conjunction with resistors R14 and R15. This helps to decrease the switching time interval by limiting the magnitude of any charge generated across stray capacitances in the circuit during reverse biasing of the diodes D1–D4.

In operation, the PCM data stream is fed to the D input of the flip-flop FF. When the data input is high, the Q and $\overline{Q}$ outputs will go high and low respectively, during a positive transition of the clock source S2. Conversely, when the data input is low, the Q and $\overline{Q}$ outputs will go low and high respectively during a positive transition of the clock S2. This drives the transistors Q1 and Q2 differentially in a well known manner. When transistor Q1 is conducting, diodes D1 and D3 are forward-biased so that the 140MHz carrier from the source S1 is coupled through windings T1-3, T1-1, T2-1 and T2-2 to the output of the modulator.

When output Q of the flip-flop FF goes low, $\overline{Q}$ goes high turning transistors Q1 and Q2 off and on respectively. This turns off diodes D1 and D3 and turns on diodes D2 and D4 so that the 140MHz carrier is now conducted through windings T1-3, T1-2, T2-1 and T2-2 to the output of the modulator. The windings of transformer T1 as indicated by the dots, are such that the 140MHz carrier output goes through a 180° phase reversal as shown in FIG. 3 when the modulator is switched.

Figure 2:
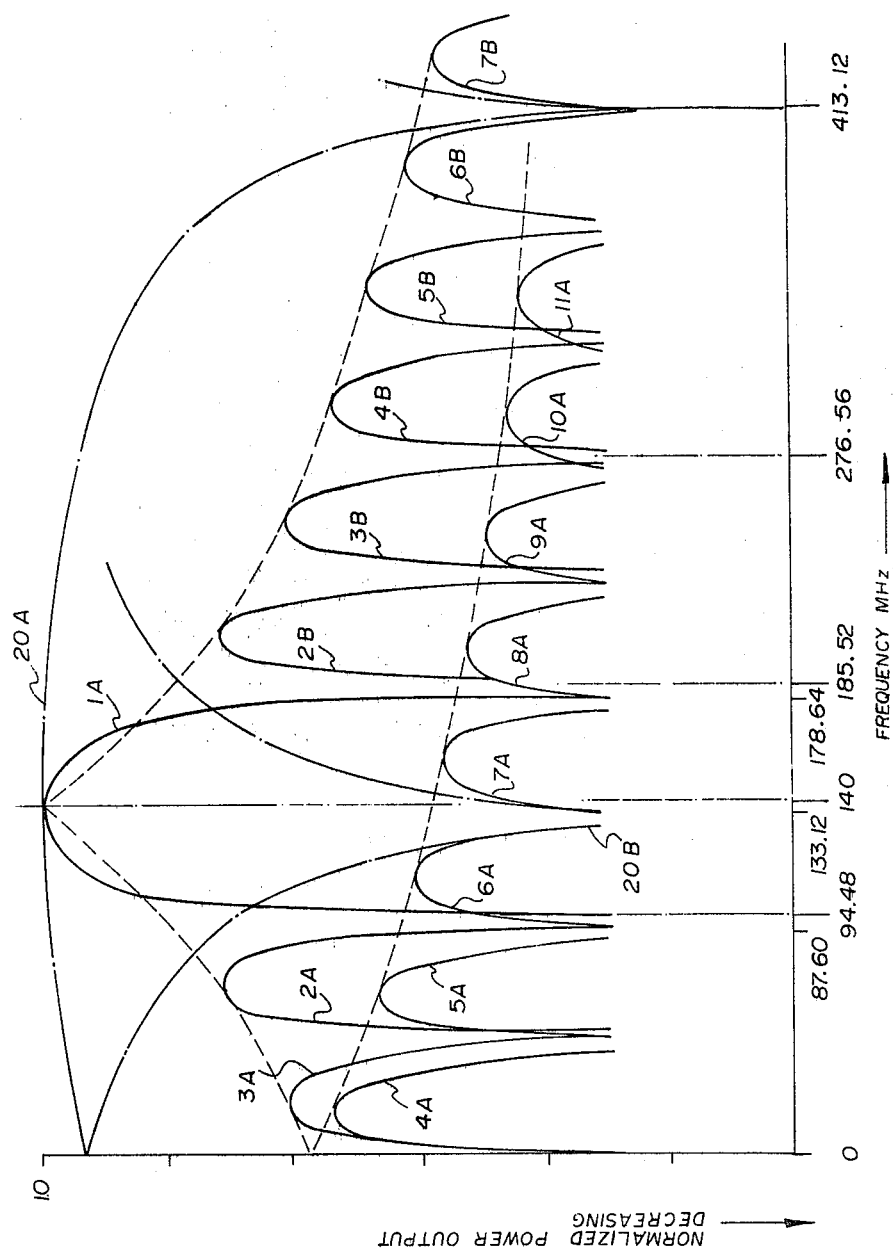
FIG. 2 is a typical power spectrum of the digital phase modulator illustrated in FIG. 1.

These periodic phase reversals of the 140MHz carrier at a 45.52MHz rate, generate a power spectrum centered about 140MHz in a well known manner, as shown in FIG. 2. The power spectrum comprises a main lobe 1A centered about 140MHz with a series of ever-decreasing pairs of side lobes 2A, 2B, . . . 11A having nulls in the energy spectrum spaced at the data rate of 45.52MHz from the carrier frequency. Thus, the first null above the 140MHz carrier occurs at 185.52MHz while the first null below the carrier occurs at 94.48MHz. As mentioned previously, the side lobes fold over about zero frequency creating two spurious side lobes 6A, 7A within the passband of the main lobe 1A having nulls at 87.60, 133.12 and 178.64MHz. These side lobes 6A–7A degrade the performance of the modulator.

As mentioned previously, the modulator also develops a cosine attenuation function 20A (FIG. 2) as a result of the time delay encountered during switching from one set of diodes to the other. This can be better illustrated with reference to FIG. 4 which illustrates the conduction characteristics of oppositely connected diodes D1–D2 superimposed on each other. Initially, when diode D1 is conducting, the forward voltage drop across it is approximately 0.55 volts. Upon initiation of phase reversal of the 140MHz carrier, Q1 commences to turn off while Q2 commences to turn on. Since this action is not instantaneous, the voltage drop across diode D1 commences to drop until a level of about 0.22 volts is reached, where it is considered diode D1 is fully cut off. During this interval, diode D2 has commenced forward conduction. At a point still later in time, diode D2 reaches full conduction at which time the forward voltage drop across it is 0.55 volts. This causes the 140MHz carrier at the output of the modulator to drop to zero and then increases in magnitude to the original amplitude but with opposite phase, as shown in FIG. 3. The time interval $\tau$ required for this phase reversal is dependant upon several factors, including the speed and magnitude of the switching voltages from the transistors Q1 and Q2, the stray capacitances in the modulator and the bias voltage applied from the bias source across capacitor C1. By adjusting potentiometer P1, the time delay $\tau$ can be adjusted so that a null in the cosine attenuation function occurs at a frequency of ±273.12MHz from the 140MHz carrier. Due to fold over of frequency components about zero frequency, a first null 20B in the attenuation function will occur at 140–273.12 = 133.12MHz centered between the two spurious lobes 6A, 7A of the fold-over sidebands appearing in the passband of the main lobe 1A. As a result, these spurious side lobes 6A, 7A are additionally attenuated at the output of the modulator. Typical results indicate an additional 10dB suppression of the spurious side lobes can be readily achieved with a modulation period of 22$\eta$s and a switching time of about 5$\eta$s. The bias control independently varies the frequency at which the nulls in the cosine attenuation function occur.

Because the response due to the switching delay $\tau$ follows a cosine attenuation function, nulls will appear at each odd multiple of the cosine function. It is therefore possible to utilize the second null so that the first null would occur at 140 - (273.12/3) = 48.96MHz. However in the present embodiment, this frequency is too close to the main lobe and would cause some amplitude roll-off in the passband. Thus, while a significant reduction in the switching speed ($\Delta V/\Delta t$ i.e. the change in the voltage applied to the diodes with respect to time) will attenuate the higher order sideband energy, it will yield some in-band amplitude roll-off if it increases the switching time (the elapsed time required by the diodes to fully change state).

It will be evident from the prior art reference that other polarity configurations of the diodes can be used in split-ring modulators. In the present embodiment, the polarity of all diodes is the same. With this arrangement differential drive of the diodes is required while the bias source is coupled longitudinally thus effecting independent adjustment of the switching time.

What is claimed is:

1. A split-ring modulator comprising:
   two pairs of diodes, each pair connected in like series;
   first and second intermediate ports connected in a ring configuration with the free ends of the diodes;
   a first input/output port, transformer coupled to both the intermediate ports;
   a second input/output port connected between the junctions of the two pairs of diodes;
   a third input/output port, coupled between center points of the two intermediate ports and the center point of the second input/output port;
   means for coupling a carrier signal and a data switching signal to, and a modulated output signal from, different ones of the three input/output ports; and
   means for applying a reverse bias to said diodes of such magnitude to minimize the magnitude of the fold-over sidebands which fall in the in-band response of the modulated output signal.

2. A split-ring modulator as defined in claim 1 in which the carrier signal is coupled to the first input/output port, the modulated output signal is coupled to the second input/output port and the data switching signal is coupled differentially to the third input/output port, with respect to the center point on the second input/output port, and in which a d-c bias source is coupled longitudinally to the third input/output port with respect to said center point of the second input/output port.

3. A split-ring modulator as defined in claim 2 in which the first input/output port is a primary and the first and second intermediate ports are first and second secondaries respectively of a first transformer;
   in which the second input/output port is a center tapped primary of a second transformer; and
   which includes a first and a second pair of series connected resistors connected in shunt with the first and second secondaries respectively, the third input/output port being connected between the junctions of the two pairs of resistors and the center tap on the primary of the second transformer.

4. A split-ring modulator as defined in claim 3 which additionally includes a first and a second resistor for connecting the d-c bias source equally to the junctions of the two pairs of resistors.

5. A split-ring modulator comprising:
   first, second and third ports each having a first terminal, a second terminal and a centered third terminal;
   a fourth port including the third terminals of the second and third ports and the center tapped third terminal of the first port;
   a first diode connected between the first terminals and a second diode connected between the second terminals of the first and second ports;
   a third diode connected between the first terminals and a fourth diode connected between the second terminals of the first and third ports;
   means for coupling the second and third ports to a common port;
   means for coupling a carrier signal to the common port, a data switching signal differentially to the fourth port, and a modulated output signal from the first port; and
   means for coupling a d-c bias source longitudinally to the fourth port to reverse bias said diodes to minimize the magnitude of the fold-over sidebands which fall in the in-band response of the modulated output signal.

6. A split-ring modulator as defined in claim 5 in which the second and third ports are transformer coupled to the common port;
   the first port includes a transformer having a center tapped primary; and in which the third terminals of the second and third ports are resistively coupled to the diodes.

* * * * *